United States Patent [19]

de Masi

[11] 4,159,176

[45] Jun. 26, 1979

[54] DEVICE FOR ALIGNING A PHOTOMASK ON A PRINTED CIRCUIT BOARD

[75] Inventor: Amerigo de Masi, Dreieichenhain, Fed. Rep. of Germany

[73] Assignee: E. I. Du Pont de Nemours and Company, Wilmington, Del.

[21] Appl. No.: 851,390

[22] Filed: Nov. 14, 1977

[30] Foreign Application Priority Data

Nov. 26, 1976 [DE] Fed. Rep. of Germany ....... 2653707

[51] Int. Cl.² ............................................. G03B 27/02
[52] U.S. Cl. ........................................ 355/79; 355/86; 355/99; 355/125
[58] Field of Search ........................ 355/78, 79, 86, 95, 355/99, 126, 127, 26

[56] References Cited

U.S. PATENT DOCUMENTS

| 3,580,676 | 5/1971 | Sarka et al. | 355/86 |
| 3,639,056 | 2/1972 | Gerson | 355/95 X |

Primary Examiner—Richard A. Wintercorn

[57] ABSTRACT

There is described an exposure frame for aligning and holding photomasks in registration with a printed circuit board coated with a light sensitive material. The printed circuit board is held between an independently adjustable mounting strip and slides. A contact strip is floated on the mounting strip by a spring mounting to permit the slides to position the printed circuit board relative to the photomask. The photomask, in turn, is mounted on the adjustable mounting strip. This facilitates good registration between the board and mask.

13 Claims, 5 Drawing Figures

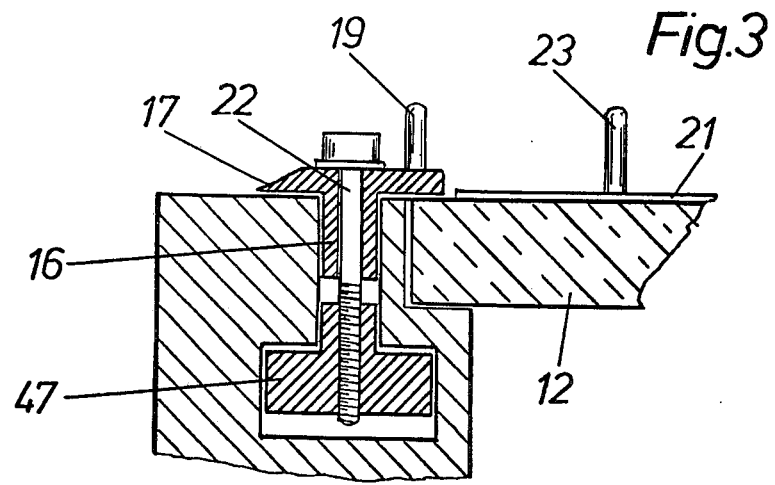
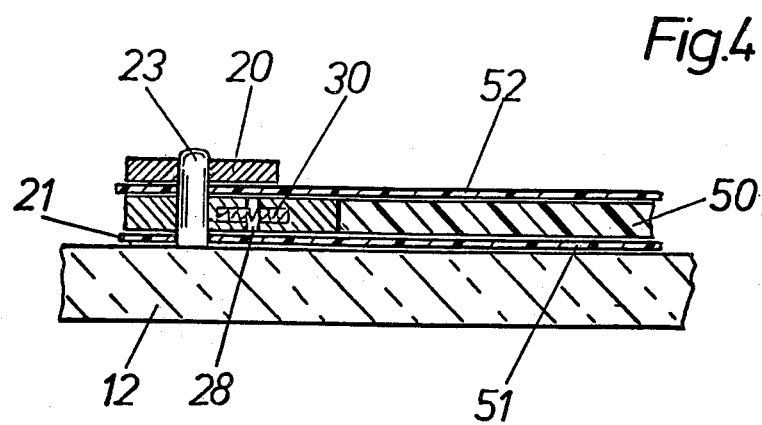
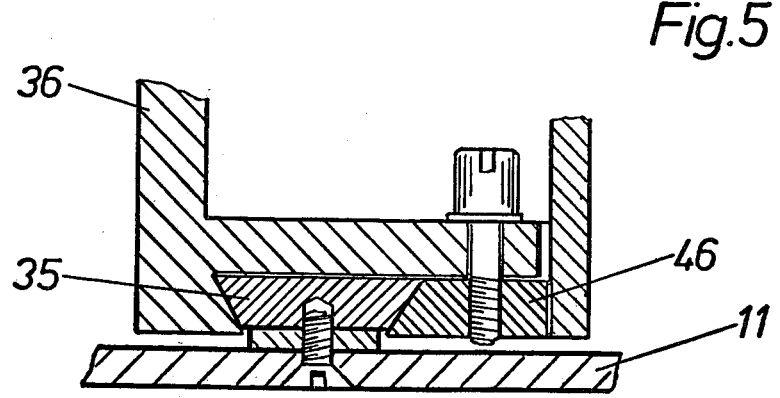

DEVICE FOR ALIGNING A PHOTOMASK ON A PRINTED CIRCUIT BOARD

FIELD OF THE INVENTION

This invention concerns an exposure frame useful in aligning and holding image bearing transparencies in registration over a substrate coated with a light sensitive material for exposure to actinic radiation.

BACKGROUND OF THE INVENTION

It is often necessary to expose an image from a transparency onto a light sensitive receiving element. Such receiving element can be a printed circuit board, a conducting foil, elements used in etching, etc. In practice, such elements are brought into contact with the image bearing transparency in a printing frame or similar device and exposed to a special light source. In the case of printed circuit boards, the boards are generally pre-worked to have predrilled holes in a predetermined arrangement. A difficulty arises in assuring good registration, i.e., an accurate fit, between the transparency and the board, especially when several boards are to be consecutively exposed. The problem is compounded in cases involving two-sided printed circuit boards. In these cases, the exposure takes place, as a rule, simultaneously from both sides using two transparencies; hence, good registration must be obtained on both sides of the board.

In order to assure such good registration, the practice has been to visually align the transparency (commonly referred to in the trade as photomask) with the printed circuit board and to secure it to the board with adhesive tape. This method, however, is not very accurate and is somewhat dependent of operator's skill. In addition, this method is cumbersome and productivity is low.

In an effort to partially eliminate the deficiencies of this visual alignment method, holding pins have been used to hold the photomask and board together through alignment holes in both. In principle at least, the desired reproducibility of alignment when replacing boards can be obtained by this method provided, of course, that the alignment holes are located in both the printed circuit board and the photomask with sufficient accuracy so that the pattern to be reproduced remains in registration with the punched holes in the board. The disadvantage of this method is, however, that once punched, the photomask can no longer be adjusted in relation to the board, and therefore, any misalignment due to punching and manufacturing tolerances between the printed circuit board and the transparency cannot be corrected. This disadvantage results in a high number of rejections or refinishing operations.

German patent application DT-OS No. 2,330,726 discloses a device for exposing single and double sided printed circuit boards. The device comprises a printing frame which includes means for mounting a transparency. These means in turn comprise a working surface within a frame on which a transparency may be adhesively affixed and which working surface can be moved in two directions in one plane by means of adjusting screws on the mounting frame. Holes through the working surface allow alignment pins to be passed through to center the printed circuit board to be exposed over the transparency taped on the work surface. Special alignment holes therefore must be formed on the bottom work surface as well as the printed circuit board to permit insertion of the alignment pins. The disadvantage of this method is that evacuation of the printing frame is more complicated and every time a new transparency is used, it must be realigned and retaped on the work surface. In addition, the thumb screws used to move the work surface which holds the transparency is cumbersome. Since the aligning holes on the printed circuit are not absolutely tolerance free, the board can shift some, thus destroying an initially well aligned arrangement.

In this device, therefore, a trial exposure is recommended before actual exposure. Using this device, it is difficult to quickly and accurately compensate for manufacturing tolerances on the boards, especially if after each subsequent alignment, one needs one or more trial exposures. Another disadvantage to this method is that whenever the size of the printed circuit board is changed, the bottom work surface must be punched again to permit passage of the holding pins at the new location. The result is that the bottom work surface must be provided with a large number of perforations which are always present within the area that will be exposed. These create local variations in the exposure, especially in cases where a change is made from small printed circuit boards to printed circuit boards of a larger format.

SUMMARY OF THE INVENTION

Accordingly, it is an object of this invention to provide an apparatus which allows for improved manual alignment aided by visual inspection of transparencies and a workpiece such as a printed circuit board bearing a photosensitive layer. This alignment is obained more easily and with better accuracy than with the devices heretofore known, both in cases involving single side exposure or simultaneous exposure on both sides of the board. The subject device reduces the need for trial exposures and allows the use of mass produced, prepunched boards and compensates for manufacturing tolerances.

To achieve these objectives according to this invention, it is contemplated to use a printing frame having top and bottom frames which further includes a holder for the photomask or masks and a printed circuit board holder. The photomask holder is independently adjustable relative to the board holder, and both are independently adjustable with respect to the bottom frame. The board holder comprises essentially self locking adjusting means which may be hand operated to shift and rotate the printed circuit board with respect to the photomask. The photomask holder includes a spacer which abuts the printed circuit board along one edge.

As a result of this inventin, it is now possible (as compared to the prior known devices) to first roughly align the photomasks and the printed circuit board in the printing frame, lock the guiding devices provided in the frame to maintain this rough alignment, and then achieve a precise registration by inspection and manual adjustment of micrometer type mechanisms available on the board holding device. A further advantage of this invention is that in the case of a simultaneous two-sided exposure of a printed circuit board, that is where one photomask is placed on one side and a second photomask is placed on the other side of the board; the two photomasks are installed and held jointly on the photomask holder so that both are aligned with respect to each other and the printed circuit board is shifted or rotated until it is in exact alignment with the upper photomask. Since the two photomasks have not been moved and are already prealigned, registration of the bottom photomask with respect to the printed circuit board has occurred automatically. Aside from the fact that only a single alignment of the board with respect to the photomask is required, the possibility of the second photomask shifting with respect to the board during the alignment of this board is reduced. Neither the bottom nor the cover panel of the printing frame has any perforations, so that exposure defects resulting because of these perforations are reduced. Dirt particles, which tend to settle in and around these perforations and cannot be removed after closing, are prevented.

The operator need only manipulate the basically self locking adjusting means to achieve the registration. The device according to this invention is useful in conjunction with exposure apparatus and copying equipment of various designs as, for example, the apparatus shown in German patent application DT-AS No. 2,060,827. The absence of perforations within the work area eliminates the problem of bubble formation between the photomask and the printing frame panel when the device is used in a vacuum frame and vacuum is applied.

In a preferred embodiment of the invention, the photomask holder and the board holders and located at opposite ends of the combined board and photomask. This way, an especially favorable interaction of the guide for the photomask holder and the printed circuit board holding device is obtained. Furthermore, it facilitates placing all holding devices outside the exposure zone to eliminate difficulties due to shadow projection from the holding devices onto the work area.

The photomask holder comprises a thin holding strip having at least two outwardly extending holding pins, said strip being movably attached on two parallel edges of the bottom frame such that it may be moved along the bottom frame essentially parallel to a third edge which carries the printed circuit board holder. It is thus possible to attach photomasks securely and accurately to the photomask holder without the need of any adhesive means. Where different size photomasks are to be used, it is possible to provide a large number of holding pins on the photomask holder and punch one side of the photomask, so that the perforations will fit over the holding pins when the photomask is positioned on its holder. If necessary, photomasks may be constucted with a reinforced edge for this purpose.

Within the scope of this invention, in the preferred embodiment, a spacer is provided in the photomask holder, having essentially the same thickness as the printed circuit board and extending essentially parallel to the actual holding strip. The spacer may comprise a pair of parallel strips (movably facing each other). In more detail, this spacer is comprised of two sections, a mounting strip and a contact strip, separate from each other, each extending parallel to each other on the same plane. This spacer allows the top photomask to lie smoothly over the printed circuit board by providing a zone of transition between the point of attachment of the photomask and the printed circuit board. The printed circuit board, when placed in its proper position, abuts on the contact strip. Since the contact strip is removed from the mounting strip, any rotating or moving or other adjustment of the printed circuit board will not destroy the smoothness of the transition zone between the photomask and the printed circuit board. As a result, the printed circuit board can be moved under the top photomask for alignment without shifting the photomask. Also, when vacuum is applied in the printing frame, no relative movement of any kind can occur between the photomask and the printed circuit board. Pulling in of the flexible photomask at the edge of the workpiece is prevented because of the presence of the contact strip. The two strips comprising the spacer are preferably connected to each other using a yielding connector such as a compression spring, which maintains the strips separated by a small distance. As a result, the insertion of the printed circuit board is made considerably easier; it is also assured that the printed circuit boards are in continuous contact with the holding elements of the board holder on which there is exerted a certain pressure.

In the preferred embodiment of the invention, the printed circuit board holder comprises two parallel, preferably slideable supports for cross slides running on one edge of the bottom frame, each of which carries a holding pin for mounting the printed circuit board. The latter may comprise holes in its edge area for the pin of each cross slide to go through. Each slide incorporates an adjusting mechanism which allows micrometric movement of the holding pins in two orthogonal directions in a plane parallel to that of the bottom frame plane within the printing frame.

BRIEF DESCRIPTION OF THE DRAWINGS

The invention is better understood by reference to the following drawings.

FIG. 3 shows a cross section according to line 3—3 of FIG. 2.

FIG. 4 shows a cross section according to line 4—4 of FIG. 2.

FIG. 5 shows a cross section according to line 5—5 of FIG. 1 extending through the cross slide housing while eliminating the inside cross slide parts for clarity's sake.

DESCRIPTION OF THE PREFERRED EMBODIMENT

Figure 1:
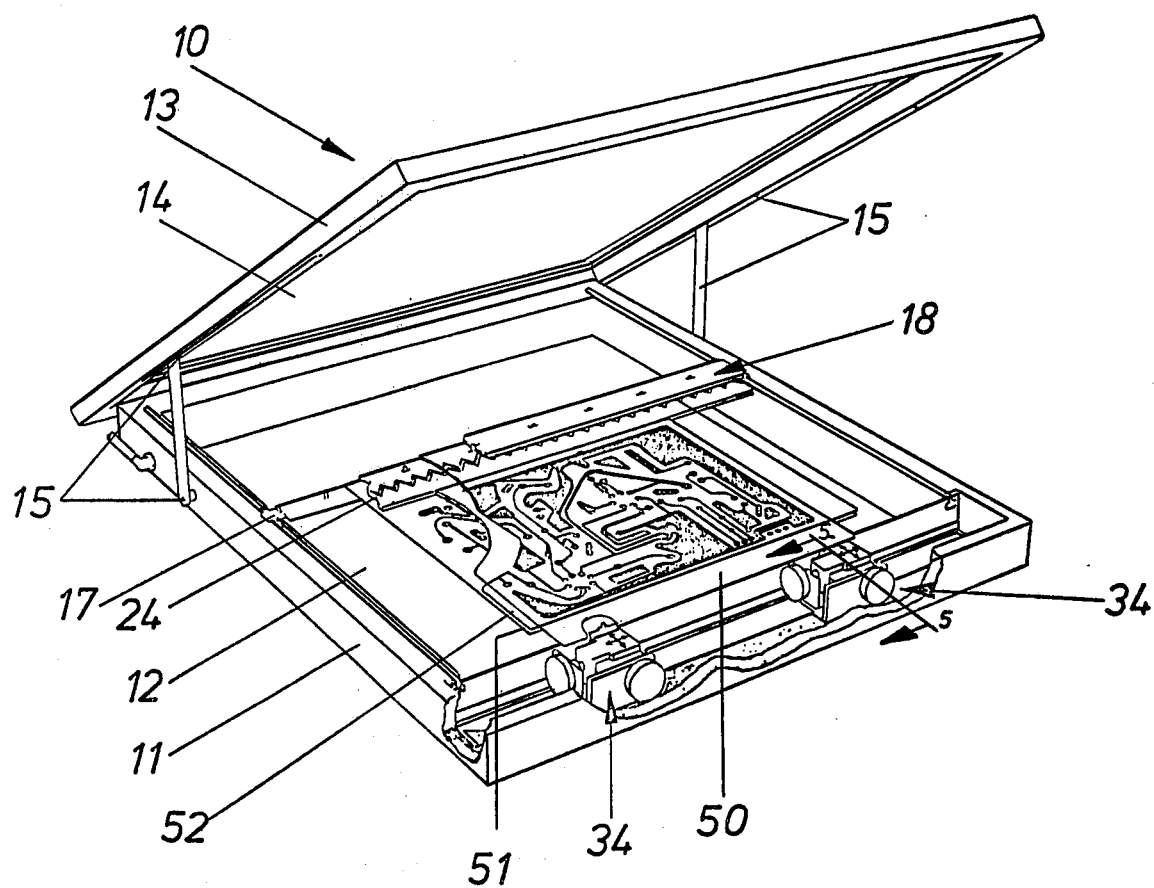
FIG. 1 shows in perspective a printing frame with an alignment device of the type described in this invention, having part of the frame removed to better show its contents.

In the embodiment shown in the drawing, the alignment device is installed in a printing frame 10 which comprises a bottom frame 11, having a light permeable, permanently installed rigid bottom panel 12 and a top frame 13, having a flexible but permanently mounted cover panel 14, thereon. The top frame 13 is pivotally mounted on the bottom frame 11 by means of hinged arms 15 and can be positioned in air tight relationship on the bottom frame 11.

Along the two sides of the bottom panel 12 extend guide channels 16 as an integral part of the side pieces of the bottom frame 11. A guide or slide 17 is slideably installed in each side piece and is adapted to carry a strip-like photomask holder 18 extending across and above the bottom panel 12. The guide channels 16 have a T-shaped profile while the slides 17 each have also a T-shaped profile which can be inserted in the guide channel 16 and locked into position using a screw bolt with a narrow head 22. This arrangement is better shown in FIG. 3. In addition, each slide 17 carries a mounting pin 19 so that the cover strip 20 can be attached on the photomask holder 18.

The photomask holder 18, as shown in the present embodiment, comprises a thin holding strip 21 having a thickness of about 3/10 of a mm which extends over and across bottom panel 12. The holding strip 21 rests on the bottom panel 12 which is attached to the bottom frame 11. On the top side the holding strip 21 carries a number of holding pins 23, pointing upward. The photomask holder 18 additionally comprises a spacer 24 which in the preferred embodiment comprises a pair of parallel strips; specifically a mounting strip 25 which may have a series of elongated holes 26 corresponding to the location of the holding pins 23 and a contact strip 27.

Both the mounting strip 25 and the contact strip 27 on the edges facing each other may have a scalloped cut to form a zig-zag shaped separation or gap 28 therebetween. Because of this gap 28, the mounting strip 25 and contact strip 27 can be moved toward each other in a limited way. They are held apart by springs 30 which are inserted in both mounting and contact strips at a symmetrical distance on either side of the separation gap 28. The photomask holder 18 may be a cover strip 20 provided with a series of elongated holes 31 corresponding to the location of holding pins 23. On each end of the cover strip 20 there is a round hole 32 which may be placed over a mounting pin 19 located on the slide 17. Additionally, there may be a center alignment hole for attaching a centrally located holding pin 23.

In the preferred embodiment, the bottom frame 11 is built with an integral guide channel 33 at the front edge in which slides 34 are slideably positioned. A guide rail 35 with a trapezoid shaped cross section having its wider part located at the top is attached to the bottom of guide channel 33 as shown in FIG. 5. The guide rail 35 fits in a corresponding dovetail recess at the underside of each slide 34. In this preferred embodiment, two slides 34 are shown. It is possible, however, to provide more than two slides in guide 33 in order to simultaneously expose several boards. In this case one could use one pair of slides 34 for each circuit board 50.

Figure 2:
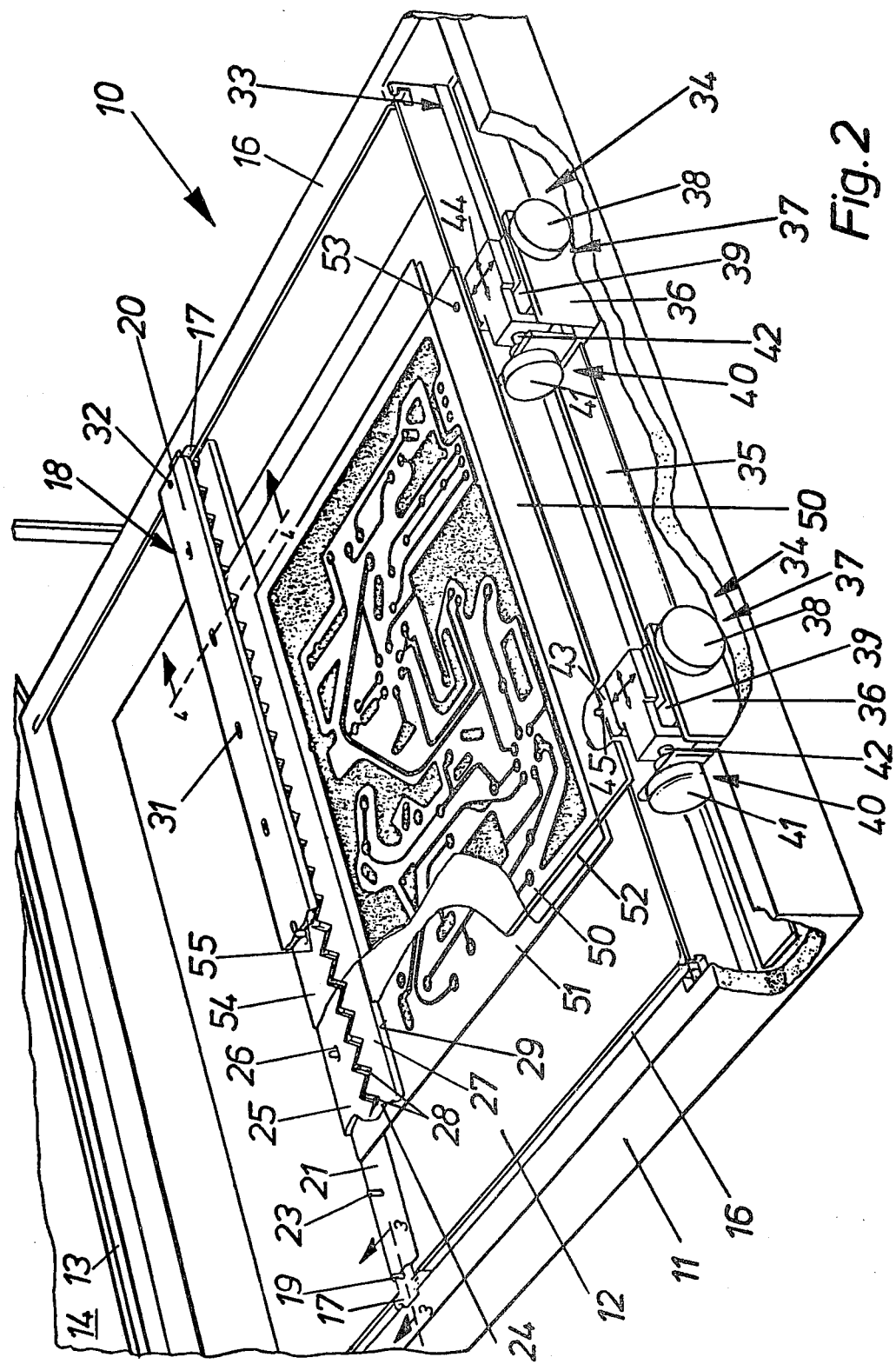
FIG. 2 shows an enlargement of a portion of FIG. 1.

With reference now to FIG. 5, each of the slides 34 has an outside body 36 which slides on guide rail 35 and carries an adjusting mechanism 37 (shown on FIG. 2) incorporating a screw spindle and knurled actuating knob 38. The threaded spindle for this adjusting mechanism 37 fits in an internally threaded cavity in a floating support 39, so that the support 39 within slide 36 can be moved by turning knob 38 in a direction toward or away from the photomask holder. The support 39 further carries a second adjusting mechanism 40 including a knurled adjusting knob 41 and a threaded spindle 42. The threaded spindle 42 fits in an internally threaded hole in a floating holding pin carrier 43 so that holding pin carrier 43 can be adjusted to slide along support 39 in a direction along the guide channel 33 by rotating the knob 41. The adjustment possibilities and directions are indicated in FIGS. 1 and 2 by arrows upon 44. Each holding pin carrier 43 includes a holding pin 45. The slides 34 further comprise clamping jaws 46 with a clamping screw 47 which can be hand operated to lock the slide on guide rail 35.

In the preferred embodiment, this board may be coated on both sides with a layer of electrically conductive material such as for example copper, over which a light sensitive reproduction layer such as a photoresist layer has been laminated thereon and may have been prepunched to provide for the eventual mounting of electronic components. The light sensitive layer is exposed imagewise by means of a photomask 51 and a photomask 52, each located on either side of the board, prior to treatment to remove the copper coating at the desired locations. To attach this board on to slide pins 45 the broad is provided with two alignment holes 53 along one of its edges. The photomasks 51 and 52 are to be placed on opposite sides of the board; each is provided with a holding edge 54 in which alignment holes 55 are located. These alignment holes fit over holding pins 23. If necessary, a thin foil reinforcement may be provided on the photomasks around the perforations. This reinforcement could be metal or plastic or any other suitable material.

In operation the device may be used as follows:

I. Preparation of the photomasks 51, 52:

The photomasks 51 and 52 needed for the two-sided exposure of the double-sized coated, printed circuit board 50 are first placed in front of a light box or similar device and aligned relative to each other. To facilitate this, markings may be provided on the photomasks. Following alignment both photomasks 51 and 52 are perforated while held together with a precision perforator in the locations corresponding to the arrangement of holding pins 23 of holding strip 21. Following perforation, the lower photomask 51 corresponding to the underside of the printed circuit board is placed on the holding pins 23 of holding strip 21 taking advantage for alignment purposes of holes 26. Next, the other (upper) photomask 52 is placed on holding pins 23 with spacer 24 in between the two photomasks. The covering strip 20 is finally placed over the top of the sandwich-like structure and fastened by inserting the round end hole 32 over mounting pins 19 of guide slides 17.

II. Fitting and adjusting the first printed circuit board 50 of the material to be exposed:

The board 50, which may be a photoresist plate useful in printed circuits comprising an epoxy or fiberglass board with a copper lamination on both sides over which exists a light sensitive photoresist layer is placed by means of the alignment holes 53 on pins 45 located on the body 36. The first step is to bring this board into rough alignment with the photomask by sliding both slides 34 along the guide rail 35, as well as moving the strip-like photomask holder 18, so that the combination photomask and board is in rough alignment in the middle of the frame. The slides 17 are locked using a T-shaped clamp and screw 47 (FIG. 3), and the slides 34 and locked into position using clamp 46.

Following this preliminary rough alignment, the micrometric type aligning means 37 and 40 on the two slides 34 are adjusted so that the prepunched holes or other indicators in the board 50 are lined up exactly with the corresponding markings on the photomask 52. The photomask may or may not be transparent at visible wave lengths in areas which are opaque in the actinic region. Whenever necessary, rotation of the board 50 is obtained by moving one of the edges supported by one of the two slides 34 more in one direction than in the other. During this fine adjustment procedure, the contact strip 27 can move but never loses contact with the board because its contact edge 29 is biased against the printed circuit board through springs 30. In order to prevent any undesired movement of the adjusting mechanism 37 and 40 on slide 34, they can be built relatively heavy or of a slightly binding fit; it is also possible to install additional lock nuts or other locking means not shown on the adjustment spindles 42, which can be tightened once alignment has been obtained.

III. Exposure of the material to be copied:

The top frame 13 is closed and locked on bottom frame 11 for exposure. Vacuum is applied to the printing frame prior to such exposure. As a result of the vacuum application, the flexible cover panel 14 is pressed firmly against the combination of the two photomasks 51 and 52 and the board 50 located between them. Since the contact strip 27 with the contact edge 29 is located firmly against the edge of the board 50 and the separation gap 28 is scalloped or zig-zag shaped, sags in the top photomask due to vacuum application are generally prevented. The exposure takes place from both sides through bottom panel 12 which may be a glass plate on bottom frame 11 and the transparent flexible cover panel 14 on the top frame 13. Following exposure, the vacuum is released and the board 50 removed from the frame for further processing.

IV. Function of the spacer 24:

The spacer 24 has the same thickness as the laminated board 50 to prevent the bending of the aligned photomasks which could lead to loss of alignment when vacuum is first applied. Voids between the spacer 24 and the board 50 must be avoided. This is achieved using a two-piece spacer 24 as described above, whereby the mounting strip 25 is firmly held on pins 23. Because contact strip 27 is spring loaded with respect to the mounting strip 25 and positioned with its contact edge 29 against the edge of board 50, there is little or no void between the workpiece and the spacer 24. Additionally, the zig-zag shape of the separation plane 28 shown in the preferred embodiment minimizes bending and pulling of the top photomask 52 during the application of vacuum. It is within the scope of this invention to vary the design of separation gap 28; for example, it could be saw-toothed shaped, sinusoidal or some other similar shape; however, it is preferred that it be free from long sections which run parallel to the strip contact edge 29.

V. Alignment of additional boards 50:

Having exposed and removed one board 50, additional boards of the same type can be placed in the device. In this case there are no further adjustments required whenever the aligment holes on the boards have been accurately located. If, however, there are deviations, the necessary correction can be rapidly achieved by minor adjustment of adjusting mechanisms 37 and 40 on slides 34.

In the preferred embodiment, two-slided exposure of photoresist plates is disclosed. It is also possible using the same device to provide a single-sided exposure. In this case bottom photomask 51 is omitted or can be replaced by a protecting piece of film placed over the bottom panel 12. The aligning procedure, however, is done in exactly the same way as explained above, using only the top photomask 52. In addition, use of the device is not limited to the exposure of photoresist plates for printed circuits, but is useful for all types of exposures in which an image bearing transparency must be copied in alignment with a light sensitive receiving element.

I claim:

1. A device for the visual-manual aligning and holding of a laminated workpiece which has a light-sensitive layer on one side adjacent a master image bearing copy in a printing frame, said frame having a bottom frame and a bottom panel mounted in it and a top frame with a cover panel which can be placed on the bottom frame, wherein the bottom frame includes a holder for the master copy and a holding device for the workpiece positioned in the bottom frame and independently adjustable; the holding device for the workpiece contains adjusting mechanisms to be actuated by hand, while the master copy holder has a spacer adapted to be applied to one edge of the workpiece to provide a smooth transition for said master image bearing copy from said holder to said workpiece.

2. A device according to claim 1 wherein the master copy holder and holding device for the workpiece are arranged at opposing edges of the assembly of the workpiece and master copy.

3. A device according to claim 2 wherein the master copy holder contains a thin holding strip, with at least two holding pins pointing upward, which is movably supported on two side edges of the bottom frame, extending on the bottom panel generally parallel to the edge of the bottom frame which carries the holding device for the workpiece.

4. A device according to claim 3 wherein the devices for the movable support of the master copy holder can be locked on the bottom frame.

5. A device according to claim 4 wherein guide channels on the bottom frame are constructed with a T-shaped cross section, in each of which a guide piece is arranged with a T-guide piece which can be secured to said bottom frame.

6. A device according to claim 3 which includes a spacer in the master copy holder which has about the same thickness as the workpiece, which extends generally parallel to the actual holding strip and consists of a pair of strips which are movable against each other, namely, a mounting strip and a contact strip whereby between the mounting strip and the contact strip a separation gap is formed which is essentially free from regions extending parallel to the contact strip edge.

7. A device according to claim 6 wherein the two strips of the spacer are connected with each other by means of yielding devices.

8. A device according to claim 6 wherein the separation gap is zig-zag-shaped saw-tooth-shaped, sinusoidal or the like.

9. A device according to claim 1 wherein the master copy holder contains a thin holding strip with a row of holding pins, a spacer formed by two parallel strips provided with holes, preferably elongated holes corresponding to the holding pin arrangement and a cover strip for covering the holding strip and the spacer also provided with holes in the same arrangement and at least one fitted borehole.

10. A device according to claim 9 wherein the cover strip is provided at both its ends with additional boreholes.

11. A device according to claim 1 wherein the holding device for the workpiece contains two parallel, preferably coaxial, cross slides movable at one edge of the bottom frame, each of which carries a holding pin for mounting the workpiece by means of boreholes installed in the workpiece's edge area, and each cross slide contains two adjusting mechanisms for moving the respective holding pin in two orthogonal directions parallel to the plane of the bottom panel.

12. A device according to claim 1 wherein said workpiece has a light-sensitive layer on each side thereof and a master image bearing copy is provided on each side of said workpiece adjacent said layer on each side of said workpiece, said holder holding each said master image bearing copy in alignment with each other, and said spacer providing said smooth transition for each said master image bearing copy.

13. A device for the visual-manual aligning and holding of a laminated workpiece having at least one light sensitive surface and at least one photomask in a printing frame in accurate superposition during the application of a vacuum and subsequent exposure to actinic radiation, comprising:
  a vacuum printing frame having a bottom frame with a bottom panel mounted thereon, and a top frame with a cover panel which can be placed over the bottom frame;
  a holding device having adjusting means mounted on said bottom frame for holding the workpiece and for adjusting the position and orientation of the workpiece within said frame relative to said bottom frame and said photomask, thereby allowing exact superposition of the photomask and workpiece, and a photomask holder adjustable with respect to said bottom frame for mounting said photomask independently of said workpiece, the holder comprising a spacer for abutting the workpiece whereby the spacer forms a smooth transition zone for said photomask from said holder to said workpiece to prevent relative movement between the photomask and the workpiece during the application of vacuum within said printing frame.

* * * * *

UNITED STATES PATENT OFFICE
CERTIFICATE OF CORRECTION

PATENT NO. : 4,159,176
DATED : June 26, 1979
INVENTOR(S) : Amerigo De Masi

It is certified that error appears in the above-identified patent and that said Letters Patent are hereby corrected as shown below:

Column 2, line 32 "obained" should be --obtained--.

Column 2, line 52 "inventin" should be --invention--.

Column 3, line 45 "constucted" should be --constructed--.

Column 6, line 1 "broad" should be --board--.

Column 6, line 13 "sized" should be --sided--.

Column 7, line 38 "aligment" should be --alignment--.

Column 7, line 43 "slided" should be --sided--.

Signed and Sealed this

Tenth Day of June 1980

[SEAL]

Attest:

SIDNEY A. DIAMOND

Attesting Officer

Commissioner of Patents and Trademarks